(12) United States Patent
Norimatsu et al.

(10) Patent No.: US 6,380,480 B1
(45) Date of Patent: Apr. 30, 2002

(54) PHOTOELECTRIC CONVERSION DEVICE AND SUBSTRATE FOR PHOTOELECTRIC CONVERSION DEVICE

(75) Inventors: Hodaka Norimatsu; Masahiro Hirata; Akira Fujisawa; Tsuyoshi Otani; Yukio Sueyoshi, all of Osaka (JP)

(73) Assignees: Nippon Sheet Glass Co., Ltd; Kaneka Corporation, both of Osaka (JP)

( * ) Notice: Subject to any disclaimer, the term of this patent is extended or adjusted under 35 U.S.C. 154(b) by 0 days.

(21) Appl. No.: 09/573,516

(22) Filed: May 17, 2000

(30) Foreign Application Priority Data

| May 18, 1999 | (JP) | ............................................ 11-137661 |
| Jun. 18, 1999 | (JP) | ............................................ 11-173219 |
| Mar. 22, 2000 | (JP) | ........................................ 2000-080961 |
| Apr. 5, 2000 | (JP) | ........................................ 2000-103494 |

(51) Int. Cl.$^7$ ..................... H01L 31/04; H01L 31/048
(52) U.S. Cl. ............. 136/256; 136/251; 136/249; 136/255; 257/432; 257/437; 257/436; 257/434; 428/426; 428/428; 428/432; 428/220
(58) Field of Search ................... 136/256, 251, 136/249, 255; 257/432, 437, 436, 434; 428/426, 428, 432, 220

(56) References Cited

U.S. PATENT DOCUMENTS

| 4,055,442 A | * 10/1977 | Crosher ........................ 136/256 |
| 4,419,386 A | 12/1983 | Gordon ........................ 427/109 |
| 4,463,216 A | * 7/1984 | Nakano et al. .............. 136/256 |
| 5,271,960 A | * 12/1993 | Proscia ........................ 427/164 |
| 5,811,191 A | * 9/1998 | Neuman ....................... 428/427 |

FOREIGN PATENT DOCUMENTS

| JP | 3-72586 | 11/1991 |
| JP | 7-41337 A | * 2/1995 |
| JP | 9-175840 A | * 7/1997 |

* cited by examiner

Primary Examiner—Alan Diamond
(74) Attorney, Agent, or Firm—Merchant & Gould, P.C.

(57) ABSTRACT

A transparent substrate, a transparent conductive film, photoelectric conversion units, and a back electrode are stacked sequentially from a side on which light is incident. Further, intermediate films are formed between the transparent substrate and the transparent conductive film. The intermediate films are formed so that the relationship of $R_1 < R_2 \times 0.8$ is satisfied, wherein $R_1$ represents an average reflectance in a wavelength region between $(\lambda-50)$ nm and $(\lambda+50)$ nm, where $\lambda$ (nm) represents a wavelength of the light allowing the photoelectric conversion units to have an optimal spectral sensitivity characteristic, and $R_2$ denotes an average reflectance, in the wavelength region, of the photoelectric conversion device that does not include the intermediate film. In a tandem-type device including plural photoelectric conversion units, intermediate films are formed so that the average reflectance in the wavelength range is decreased in each photoelectric conversion unit. Thus, the conversion efficiency of the photoelectric conversion device is improved.

11 Claims, 4 Drawing Sheets

PHOTOELECTRIC CONVERSION DEVICE AND SUBSTRATE FOR PHOTOELECTRIC CONVERSION DEVICE

FIELD OF THE INVENTION

The present invention relates to a photoelectric conversion device such as a solar cell or the like, more particularly, to a photoelectric conversion device having a low reflectance with respect to incident light with a wavelength in the vicinity of a wavelength allowing a photoelectric conversion unit to have an optimal spectral sensitivity characteristic so as to improve the conversion efficiency of the photoelectric conversion device. The present invention also relates to a substrate for a photoelectric conversion device.

BACKGROUND OF THE INVENTION

In a thin film photoelectric conversion device such as a thin film solar cell, a glass sheet with a transparent conductive film (a transparent electrode) may be used in some cases. This thin film photoelectric conversion device is manufactured by forming, on a glass sheet, a transparent conductive film containing tin oxide as a main component, a photovoltaic unit including a photovoltaic layer, and a back electrode of aluminum or the like in this order.

As the transparent conductive film, a fluorine doped tin oxide (hereinafter referred to as "$SnO_2$:F") film has been used in many cases. This film is more excellent in chemical stability such as plasma resistance or the like compared to a tin doped indium oxide (ITO) film. Therefore, the $SnO_2$:F film does not deteriorate greatly in forming a photovoltaic layer by using a plasma CVD method. A thin film photoelectric conversion device in which an undercoating film is formed between a transparent conductive film and a glass sheet also has been known. This undercoating film functions as a barrier film for preventing an alkaline component from diffusing into the transparent conductive film from the glass sheet. As the barrier film, a silicon oxide film has been used in many cases.

A glass sheet with a transparent conductive film also is used as window glass for buildings. The glass sheet with a transparent conductive film formed thereon suppresses the outflow of heat from an opening of a building as so-called Low-E glass. In this application field, it is important that a natural appearance as window glass is provided. A tin oxide film also is one of the typical transparent conductive films in this field. However, when the tin oxide film is formed to have a thickness effective in suppressing the heat loss from an opening, the problem of interference colors (iridescence) of reflected light comes up. Therefore, JP 3-72586 B discloses the formation of two intermediate layers between a glass sheet and a transparent conductive film. Specifically, it discloses that a tin oxide film with a thickness of about 18 nm and a silicon-silicon oxide mixed film with a thickness of about 28 nm are formed sequentially from a glass sheet side and further a $SnO_2$:F film with a thickness of about 200 nm is formed on those films as a transparent conductive film.

On the other hand, the transparent conductive film used for the thin film photoelectric conversion device is required to have the compatibility between a high light transmittance and a high conductivity. However, these two properties show reciprocal tendencies and thus the compatibility cannot be obtained easily. Thus, a thin film photoelectric conversion device using a transparent conductive film itself as an antireflection film by adjusting the thickness of the transparent conductive film so that a large quantity of light reaches a photovoltaic layer also has been proposed (for instance, "Amorphous Solar Cell" by Kiyoshi Takahashi and Makoto Konagai, published by Shokodo).

However, when the transparent conductive film itself is intended to be used as an antireflection film, the thickness of the transparent conductive film is limited, which causes difficulty in controlling the conductivity. Therefore, the improvement in characteristics of the photoelectric conversion device as a whole cannot be expected. Furthermore, in a photoelectric conversion device including a plurality of photovoltaic layers having different spectral sensitivity characteristics, it is difficult to exert an antireflection effect on the plurality of photovoltaic layers merely by adjusting the thickness of the transparent conductive film.

As described in JP 3-72586 B, in the field of window glass for buildings, it also has been proposed to insert a plurality of films between a glass sheet and a transparent conductive film. However, it has not been studied yet to improve the characteristics of a photoelectric conversion device by using an intermediate film between a glass sheet and a transparent conductive film. In order to improve the characteristics of the photoelectric conversion device, consideration also must be given to the spectral sensitivity characteristics of a photovoltaic layer.

SUMMARY OF THE INVENTION

The present invention is intended to provide a photoelectric conversion device such as a photovoltaic device in which conversion efficiency is improved by employing a film structure including an intermediate film between a transparent substrate and a transparent conductive film. The present invention also is intended to provide a substrate for a photoelectric conversion device that has the above-mentioned film structure and is effective in improving the conversion efficiency.

In order to achieve the above-mentioned object, a first photoelectric conversion device of the present invention includes a transparent substrate, a transparent conductive film, a photoelectric conversion unit including a photoelectric conversion layer, and a back electrode, which are stacked sequentially from the side on which light is incident. Further, an intermediate film is formed between the transparent substrate and the transparent conductive film. The first photoelectric conversion device satisfies the relationship of $R_1 < R_2 \times 0.8$, wherein $R_1$ represents an average reflectance of the photoelectric conversion device in the wavelength region between ($\lambda$−50) nm and ($\lambda$+50) nm, where $\lambda$ (nm) indicates a wavelength of the light allowing the photoelectric conversion layer to have an optimal spectral sensitivity characteristic, and $R_2$ denotes an average reflectance, in the wavelength region, of the photoelectric conversion device that does not include the intermediate film.

A second photoelectric conversion device of the present invention includes a transparent substrate, a transparent conductive film, at least two photoelectric conversion units, and a back electrode, which are stacked sequentially from the side on which light is incident. The at least two photoelectric conversion units include two photoelectric conversion layers in which wavelengths $\lambda$ of the light allowing optimal spectral sensitivity characteristics to be obtained are different from each other. Further, an intermediate film is formed between the transparent substrate and the transparent conductive film. The second photoelectric conversion device satisfies the relationships of: $R_{11} < R_{12}$, wherein $R_{11}$ represents an average reflectance of the photoelectric conversion device in a first wavelength region between ($\lambda$−50) nm and ($\lambda_1$+50) nm, where $\lambda_1$ (nm) represents one of the wavelengths $\lambda$ in one of the two photoelectric conversion layers, and $R_{12}$ denotes an average reflectance, in the first wavelength region, of the photoelectric conversion device that does not include the intermediate film; and $R_{21} < R_{22}$, wherein $R_{21}$ represents an average reflectance of the photoelectric conversion device in a second wavelength region between ($\lambda_2$−50) nm and ($\lambda_2$+50) nm, where $\lambda_2$ (nm) represents the other of the wavelengths $\lambda$ in the other of the two photoelectric conversion layers, and $R_{22}$ denotes an average reflectance, in the second wavelength region, of the photoelectric conversion device that does not include the intermediate film.

According to the photoelectric conversion devices of the present invention, since the average reflectances are low in the wavelength regions allowing the photoelectric conversion unit to have a high spectral sensitivity characteristic, the conversion efficiency of the photoelectric conversion devices is improved. Furthermore, since the reflection in the above-mentioned wavelength region is suppressed by forming the intermediate film, it is not necessary to limit the thickness of the transparent conductive film for preventing the reflection. Thus, the conductivity is not deteriorated. In addition, the average reflectances in a plurality of wavelength regions also can be decreased corresponding to plural kinds of photoelectric conversion layers. Since the photoelectric conversion unit merely has a slight influence on the relative relationship among the respective average reflectances $R_1$, $R_2$, $R_{11}$, $R_{12}$, $R_{21}$, and $R_{22}$, the values obtained by the measurement in the state where no photoelectric conversion unit is formed on the transparent conductive film may be used as those respective average reflectances.

A substrate for a photoelectric conversion device of the present invention includes a first film with a high refractive index, a second film with a low refractive index, and a transparent conductive film, which are formed on a glass sheet in this order. The first film has a higher refractive index than that of the glass sheet, and the second film has a lower refractive index than those of the first film and the transparent conductive film. The first film has a thickness in the range between 22 nm and 60 nm.

DETAILED DESCRIPTION OF THE INVENTION

Preferable embodiments of the present invention are described with reference to the drawings as follows.

Figure 1:
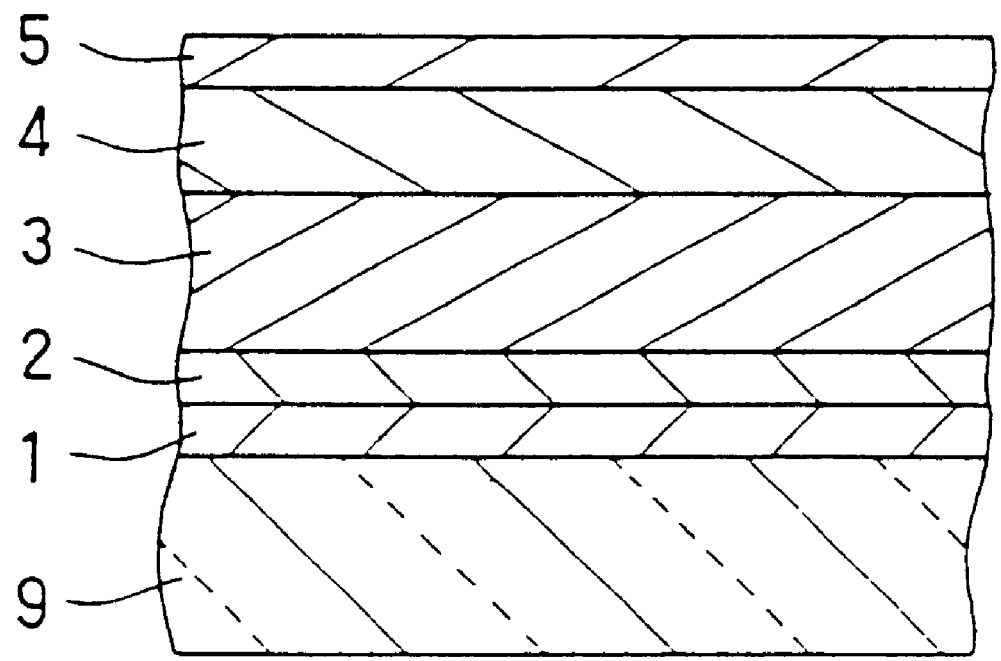
FIG. 1 is a sectional view showing an embodiment of a photoelectric conversion device according to the present invention.

FIG. 1 is a sectional view of an embodiment of a photoelectric conversion device according to the present invention. In this thin film photoelectric conversion device, a first intermediate layer 1, a second intermediate layer 2, a transparent conductive film 3, a photovoltaic unit 4, and a back electrode 5 are formed on a transparent substrate 9 in this order. In this thin film photoelectric conversion device, light is incident from the transparent substrate side.

Examples of the photovoltaic unit include a unit in which an amorphous silicon-based thin film or a crystalline silicon-based thin film is used as a photovoltaic layer (hereinafter the respective units are indicated by referring to the kind of the photovoltaic layer, such as "an amorphous silicon-based thin film photovoltaic unit" and "a crystalline silicon-based thin film photovoltaic unit"). The photovoltaic unit can be formed of a single layer, but can be formed by stacking a plurality of layers as shown in FIG. 2.

Figure 2:
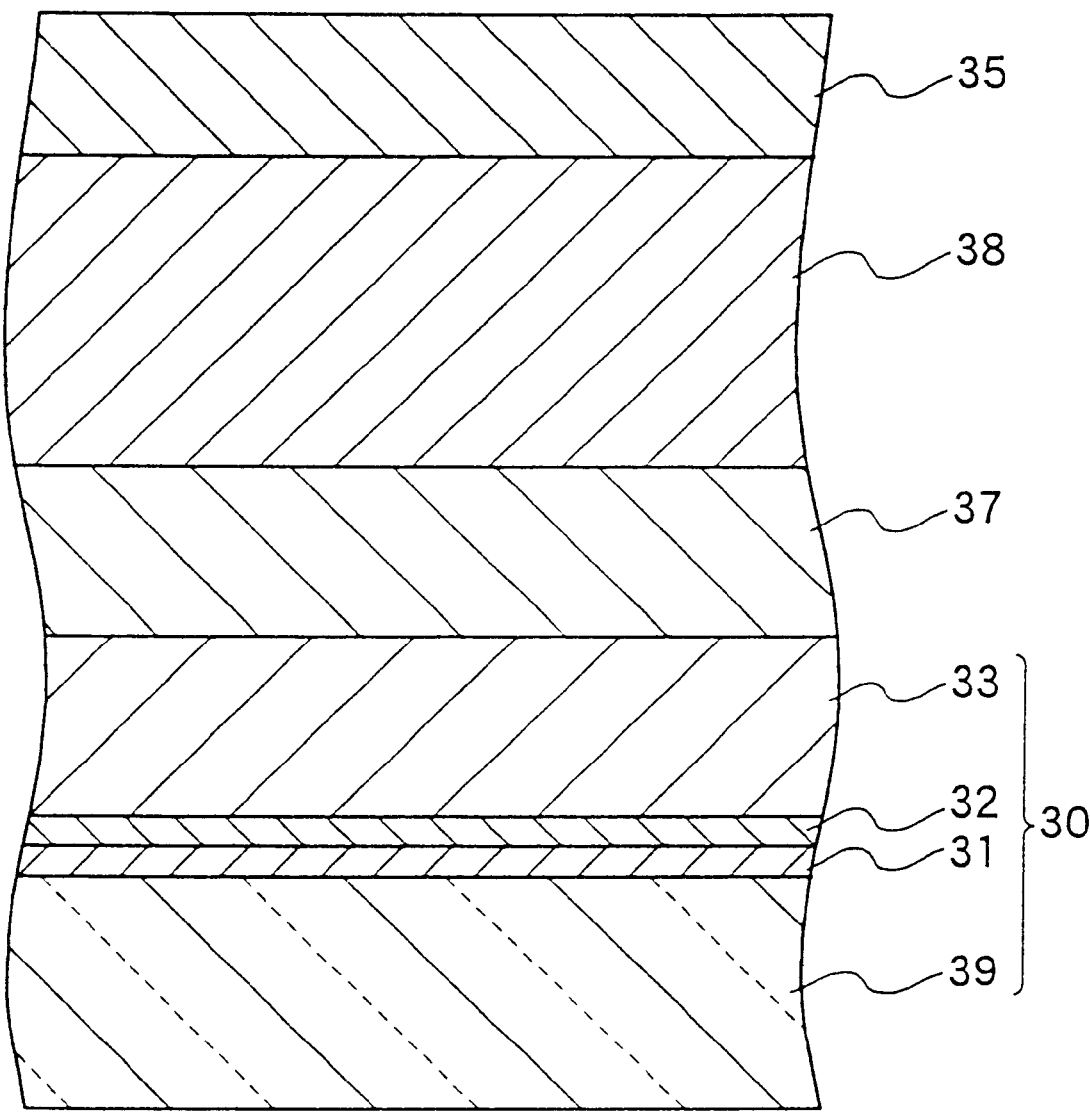
FIG. 2 is a sectional view of another embodiment of a photoelectric conversion device according to the present invention.

In the thin film photoelectric conversion device shown in FIG. 2, on a substrate 30 for a photoelectric conversion device in which first and second intermediate layers 31 and 32 and a transparent conductive film 33 are formed on a glass sheet 39 in this order, a first photovoltaic unit 37 and a second photovoltaic unit 38 are formed in this order, and further a back electrode 35 is formed thereon.

An amorphous silicon-based thin film photovoltaic unit can be formed by depositing respective p-type, i-type, and n-type semiconductor layers in this order by a plasma CVD method. Specifically, for example, it may be formed by depositing a p-type microcrystalline silicon-based layer doped with at least 0.01 atom % boron as an impurity atom determining its conductive type, an intrinsic amorphous silicon layer to be a photovoltaic region, and an n-type microcrystalline silicon-based layer doped with at least 0.01 atom % phosphorus as an impurity atom determining its conductive type in this order. However, these respective layers are not limited to those mentioned above. For instance, the impurity atom in the p-type microcrystalline silicon-based layer may be aluminum or the like, and an amorphous silicon-based layer may be used as the p-type layer. For the p-type layer, an alloy material of amorphous or microcrystalline silicon carbide, silicon germanium, or the like may be used.

It is preferable that the conductive type (p-type and n-type) microcrystalline silicon-based layers have a thickness in the range between 3 nm and 100 nm, further preferably between 5 nm and 50 nm.

It is preferable that the intrinsic amorphous silicon layer is formed by the plasma CVD method while the temperature of an undercoating is set to be 450° C. or lower. This layer is formed as a thin film of substantially an intrinsic semiconductor with a density of impurity atoms determining its conductive type of $1 \times 10^{18}$ cm$^{-3}$ or lower. It is preferable that the thickness of the intrinsic amorphous silicon layer is in the range between 0.05 µm and 0.5 µm. However, in an amorphous silicon-based thin film photovoltaic unit, an amorphous silicon carbide layer (for instance, an amorphous silicon carbide layer formed of amorphous silicon containing 10 atom % carbon or less) or an amorphous silicon germanium layer (for example, an amorphous silicon germanium layer formed of amorphous silicon containing 30 atom % germanium or less) of an alloy material may be formed instead of the intrinsic amorphous silicon layer.

Similarly, a crystalline silicon-based thin film photovoltaic unit can be formed by depositing respective p-type, i-type, and n-type semiconductor layers in this order by the plasma CVD method using the same procedure as that used for the amorphous silicon-based thin film photovoltaic unit.

It is preferable that the photoelectric conversion device of the present invention includes a crystalline silicon-based thin film photovoltaic unit. The reason is that in this unit, an open circuit voltage and a short-circuit current density are lower and higher than those caused in an amorphous silicon-based photovoltaic unit respectively, and therefore the light transmittance contributes to the conversion efficiency more than the sheet resistance in the conductive film on the glass sheet does. In the present invention, besides the amorphous silicon-based thin film photovoltaic unit, a compound-semiconductor thin film photovoltaic unit using a compound semiconductor material such as GaAs, CdTe, CIS, or the like may be used.

Figure 3:
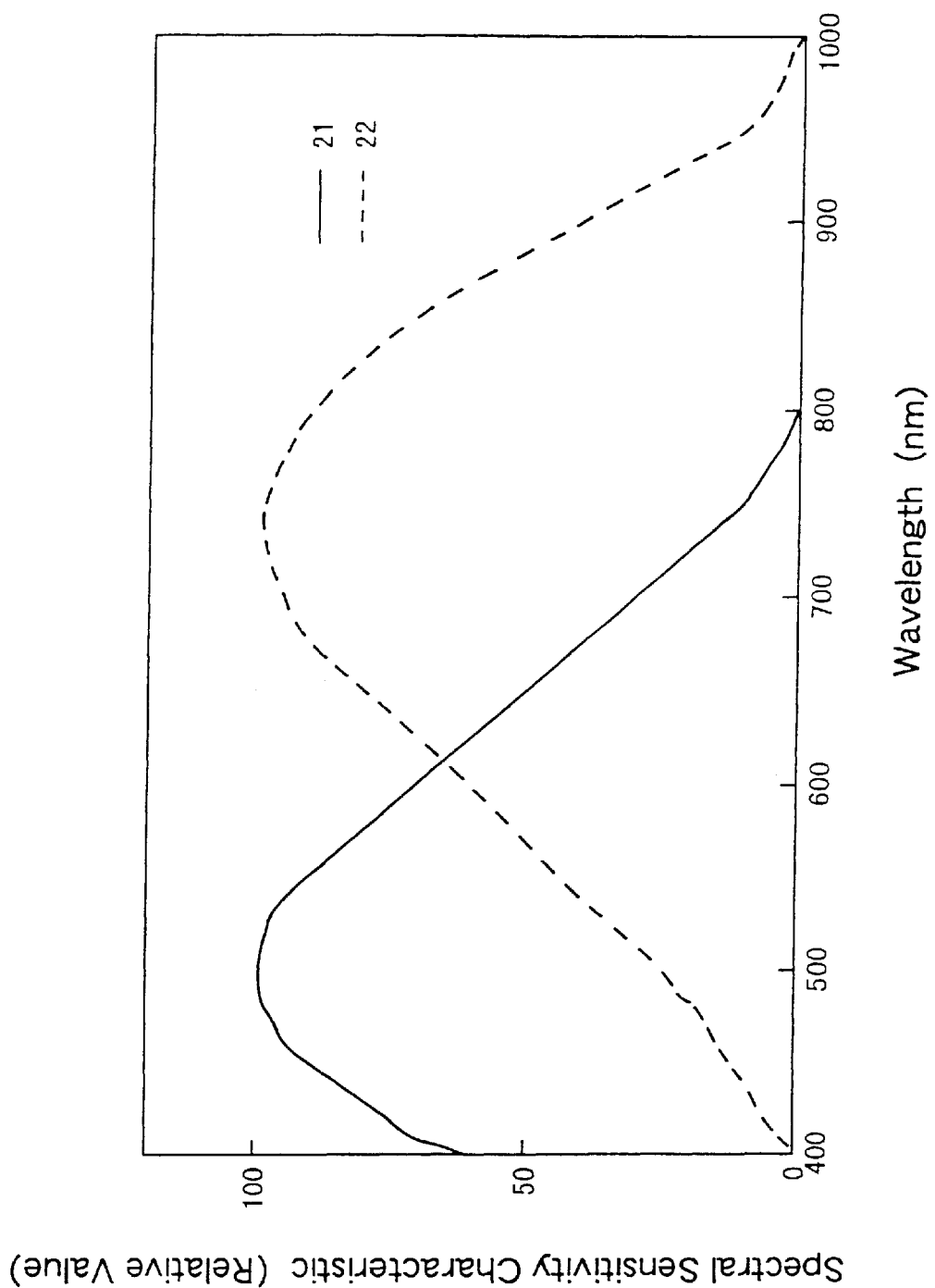
FIG. 3 is a graph showing spectral sensitivity characteristics of amorphous silicon and crystalline silicon.

FIG. 3 shows an example of spectral sensitivity characteristics of an amorphous silicon photovoltaic layer and a crystalline silicon photovoltaic layer. In the amorphous silicon, a spectral sensitivity curve 21 has its peak at a wavelength of approximately 500 nm. On the other hand, in the crystalline silicon, a spectral sensitivity curve 22 has its peak at a wavelength of approximately 750 nm.

In the present specification, besides a polycrystalline material, a material with a crystalline fraction in volume of at least 50% is taken as corresponding to a "crystalline" material even if amorphous portions are contained regionally. In addition to the amorphous or crystalline silicon, a semiconductor material containing at least 50 atom % silicon such as amorphous silicon germanium also is considered as the "silicon-based" material.

As the transparent conductive film 3, 33, a film containing tin oxide as a main component, specifically a tin oxide film doped with an impurity such as fluorine (a $SnO_2$:F film) or the like is preferable. However, as the transparent conductive film, an ITO film or a zinc oxide film may be used, or a multilayer film of those conductive films also may be used. The thickness of the transparent conductive film is determined suitably depending on the photovoltaic unit to be used or the conductivity required corresponding to a desired conversion efficiency. In order to use the transparent conductive film in a substrate for a photoelectric conversion device such as a solar cell or the like, it is preferable that the transparent conductive film has a thickness in the range approximately between 400 nm and 1000 nm, particularly between 500 nm and 1000 nm to secure the required conductivity.

The $SnO_2$:F film may contain trace components other than fluorine. For instance, in order to improve the conductivity, antimony may be added. This film also may contain silicon, aluminum, zinc, copper, indium, bismuth, gallium, boron, vanadium, manganese, zirconium, or the like. However, it is preferable that the concentration of the trace components is 0.02 wt. % or lower. In many cases, chlorine is introduced into the $SnO_2$:F film from a tin material. Since the chlorine causes the decrease in light transmittance, it is preferable that the concentration of chlorine is 0.4 wt. % or lower.

The sheet resistance of the transparent conductive film is not particularly limited. Specifically, however, it is preferable that the sheet resistance of the conductive film is in the range between 5 $\Omega$/sq.($\Omega/\square$) and 20 $\Omega$/sq.

It is preferable that the first intermediate layer 1, 31 is formed as a film with a high refractive index (hereinafter referred to as a "high refractive index film") having a higher refractive index than that of the second intermediate layer 2, 32. It is preferable that the material of the high refractive index film is at least one selected from tin oxide, titanium oxide, zinc oxide, tantalum oxide, niobium oxide, cerium oxide, zirconium oxide, silicon nitride, silicon oxynitride (SiON), and a mixture thereof. The preferable thickness of the first intermediate layer is in the range between 5 nm and 100 nm, wherein the lower limit in the range is preferably 20 nm, further preferably 22 nm, and particularly 25 nm, and the upper limit in the range is preferably 70 nm, particularly 60 nm. The suitable refractive index of the first intermediate layer is in the range between 1.7 and 2.7.

On the other hand, it is preferable that the second intermediate layer 2, 32 is formed as a film with a low refractive index (hereinafter referred to as a "low refractive index film") having a lower refractive index relative to that of the first intermediate layer 1, 31. It is preferable that the material of the low refractive index film is at least one selected from silicon oxide, aluminum oxide, silicon oxide containing carbon (SiOC), and a mixture thereof. A preferable thickness of the second intermediate layer is in the range between 1 nm and 60 nm, particularly between 1 nm and 50 nm. The suitable refractive index of the second intermediate layer is in the range between 1.4 and 1.8.

It is preferable that the first intermediate layer of a high refractive index film is formed as a polycrystalline film having a rough surface. The rough surface causes a scattering of light at the film interface, thus suppressing the reflection of incident light. Due to such a light trapping effect, the utilization factor of incident light on the substrate is improved. The surface roughness of the high refractive index film tends to become conspicuous when the thickness of the film increases. From such a viewpoint, it is advantageous in the substrate for a photoelectric conversion device that the high refractive index film formed to contact with a glass sheet is formed to have a thickness of at lest 22 nm.

In order to improve light transmission characteristics of the substrate, it is preferable that the first intermediate film (a high refractive index film) and the second intermediate film (a low refractive index film) are formed so that the total thickness of them is in the range between 40 nm and 70 nm. Their thicknesses can be adjusted further precisely corresponding to the thickness of the transparent conductive film.

For instance, when the thickness of the transparent conductive film is at least 400 nm and below 700 nm, a suitable thickness of the high refractive index film is in the range between 22 nm and 40 nm, a suitable thickness of the low refractive index film is in the range between 14 nm and 36 nm, and a suitable total thickness of them is in the range between 40 nm and 60 nm. Further, for instance, when the thickness of the transparent conductive film is at least 700 nm and below 850 nm, a suitable thickness of the high refractive index film is in the range between 22 nm and 60 nm, a suitable thickness of the low refractive index film is in the range between 10 nm and 40 nm, and a suitable total thickness of them is in the range between 40 nm and 70 nm. Moreover, for example, when the thickness of the transparent conductive film is in the range between 850 nm and 1000 nm, a suitable thickness of the high refractive index film is in the range between 22 nm and 45 nm, a suitable thickness of the low refractive index film is in the range between 12 nm and 36 nm, and a suitable total thickness of them is in the range between 40 nm and 70 nm.

By utilizing a light interference effect, the intermediate films suppress the reflection of light with a wavelength in the wavelength region allowing the photovoltaic unit to have a high spectral sensitivity characteristic. In the present invention, the materials forming the intermediate films, the thicknesses of the respective layers, the relationship between respective layers (when a plurality of layers are formed) are set so that the suppression of reflection contributes considerably to the conversion efficiency. On the contrary, since a conventional intermediate film merely has been used as a barrier film or an iridescence prevention film, no consideration has been given to the relationship between the intermediate film and the spectral sensitivity characteristic of the photovoltaic unit.

The intermediate film is not limited to a two-layer structure as shown in the figure. It may have a monolayer structure or a structure with three or more layers.

It is preferable that as the back electrode 5, 35, at least one metallic layer formed of at least one material selected from Al, Ag, Au, Cu, Pt, and Cr is formed by sputtering or vapor deposition. In addition, a layer formed of conductive oxide such as ITO, $SnO_2$, ZnO, or the like may be formed between the photovoltaic unit and the metal electrode. In order to obtain a so-called see-through type solar cell, conductive oxide having optical transparency as indicated above as examples may be used alone.

The transparent substrate 9, 39 is not particularly limited as long as the substrate is transparent with respect to the wavelength region effective for the spectral sensitivity characteristics of the photovoltaic unit to be used. However, a resin substrate of plastic or the like, a glass sheet, or the like is used. As the transparent substrate, a soda-lime silica glass sheet (with a refractive index of about 1.5) is preferable, which has been supplied at a low cost in large quantity. This glass sheet is manufactured by a float glass process and has extremely smooth surfaces. Its thickness is not particularly limited, but preferably is in the range between 0.5 mm and 5 mm.

In forming the intermediate films and the transparent conductive film, a so-called physical deposition method such as a sputtering method, an ion plating method, a vacuum evaporation method, or the like may be used. However, it is preferred to use a so-called chemical deposition method such as a chemical vapor deposition method (hereinafter referred to as a "CVD method"), a spray method, or the like. The physical deposition method is excellent in uniformity in film thickness. However, considering the producibility in mass-production or durability of a coating film, the chemical deposition method accompanied by a pyrolytic and oxidation reaction of raw materials is superior.

Examples of the spray method include a solution spray method of spraying a solution containing a metallic compound on a high-temperature glass sheet, a dispersion spray method in which a dispersion obtained by dispersing fine grains of a metallic compound in a liquid is used instead of the above-mentioned solution, a powder spray method in which powder of a metallic compound is used instead of the above-mentioned solution, or the like. On the other hand, in the CVD method, a vapor for forming a coating film is used.

The spray method is advantageous in that it can be carried out with a relatively simple device, but a uniform film thickness cannot be obtained easily due to the difficulty in controlling droplets or products to be exhausted (a reaction product, an undecomposed product, or the like). In addition, distortion occurs in the glass. Therefore, as a method of forming the above-mentioned respective films, overall, the CVD method is superior to the other methods.

When using the CVD method, the intermediate films or the conductive film can be formed by injecting a gaseous material on a glass sheet that has been cut to have a predetermined size and has been heated. For instance, the material is supplied while the glass sheet placed on a mesh belt is passed through a heating furnace, and the material is allowed to react on the surface of the high-temperature glass sheet, thus forming the intermediate films or the conductive film.

However, in the film formation by the CVD method, it is preferable that a film is formed on a high-temperature glass ribbon in a manufacturing process of glass by the float glass process to utilize thermal energy in forming the glass. This preferable manufacturing method is advantageous in forming a large area thin film and is particularly suitable for the manufacture of a photovoltaic unit that may be required to be formed on a large area glass sheet used for a roofing material or the like. When the CVD method is carried out inside a float bath, a film can be formed even on a glass surface having a temperature equal to or higher than the softening point, thus improving the film performance, the film growth rate, and the film formation reaction efficiency. In addition, defects such as pinholes can be suppressed.

Figure 4:
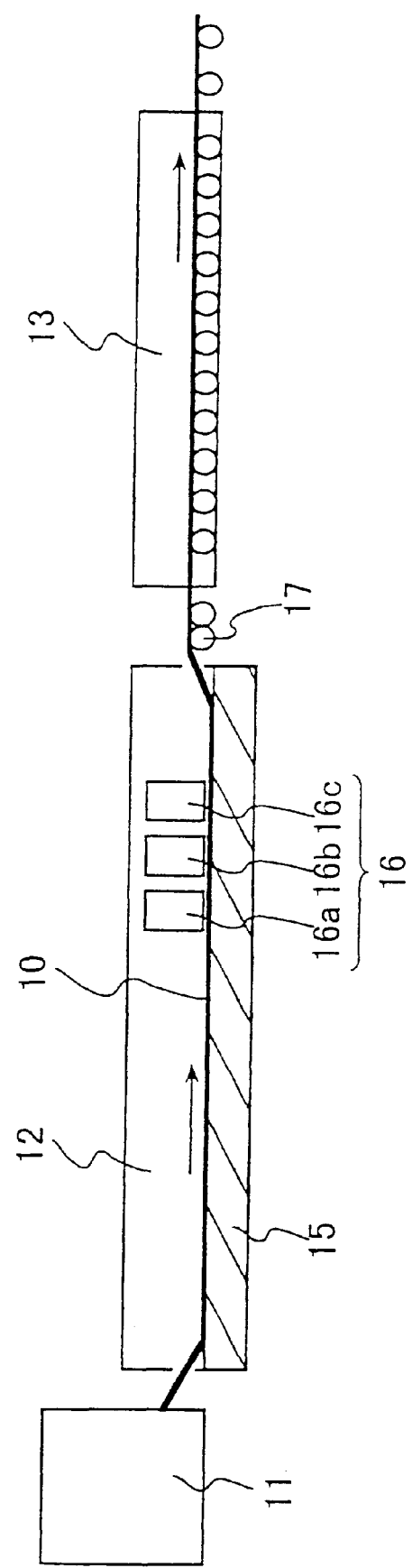
FIG. 4 is a view showing a configuration of a device that can be used for forming an intermediate film and a transparent conductive film on a glass sheet as a part of a photoelectric conversion device according to the present invention.

FIG. 4 shows an embodiment of a device for forming a film on a glass ribbon by the CVD method in the float glass process. As shown in FIG. 4, in this device, a predetermined number of coaters 16 (three coaters 16a, 16b, and 16c in the embodiment shown in the figure) are placed at a predetermined distance from the surface of a glass ribbon 10. The glass ribbon 10 is formed from molten glass, which is poured from a furnace 11 into a float bath 12, into a belt-like form on a tin bath 15 while traversing length of the float bath 12. The number and arrangement of the coaters are selected suitably depending on the kind and thickness of a coating film to be formed. These coaters supply gaseous materials to form coating films on the glass ribbon 10 continuously. When a plurality of coaters are used, an intermediate film and a transparent conductive film can be formed on the glass ribbon 10 successively by the CVD method. The glass ribbon 10 on which the respective films have been formed is lifted by a roller 17 and is carried into an annealing furnace 13. The glass ribbon 10 annealed in the annealing furnace 13 is cut by a cutting device omitted in the figure, thus obtaining a glass sheet with a predetermined size.

The film formation on the glass ribbon may be carried out using the CVD method and the spray method together. For instance, by using the CVD method and the spray method in this order (for instance, by forming a film by the CVD method inside the float bath and a film by the spray method at a downstream location from the float bath in the moving direction of the glass ribbon), predetermined stacked layers may be obtained.

Examples of tin materials in the case of using the CVD method include tin tetrachloride, dimethyltin dichloride, dibutyltin dichloride, tetramethyltin, tetrabutyltin, dioctyltin dichloride, monobutyltin trichloride, or the like, and organic tin chlorides such as dimethyltin dichloride (DMT) and monobutyltin trichloride (MBTC) are preferable. Oxidation materials used for obtaining tin oxide from a tin material include oxygen, water vapor, dry air, or the like. Fluorine materials include hydrogen fluoride, trifluoroacetic acid, bromotrifluoromethane, chlorodifluoromethane, or the like. When antimony is to be added, antimony pentachloride, antimony trichloride, or the like may be used.

Silicon materials used when a suitable silicon oxide film as a low refractive index film is formed by the CVD method include silane (monosilane), disilane, trisilane, monochlorosilane, dichlorosilane, 1,2-dimethylsilane, 1,1,2-trimethyldisilane, 1,1,2,2-tetramethyl disilane, tetramethyl orthosilicate, tetraethyl orthosilicate, or the like. In this case, oxidation materials include oxygen, water vapor, dry air, carbon dioxide, carbon monoxide, nitrogen dioxide, ozone, or the like. When silane is used, for the purpose of preventing the silane from reacting before reaching the glass surface, an unsaturated hydrocarbon gas such as ethylene, acetylene, toluene, or the like may be used also.

Similarly, aluminum materials used when a suitable aluminum oxide film as a low refractive index film is formed by the CVD method include trimethylaluminum, aluminum triisopropoxide, diethylaluminum chloride, aluminum acetylacetonate, aluminum chloride, or the like. In this case, oxygen, water vapor, dry air, or the like can be used as an oxidation material.

The intermediate films and the transparent conductive film thus formed are stacked on the top surface (the surface formed without contacting with tin in the float bath) of the glass sheet. On these films, various photovoltaic layers are formed by methods corresponding to their kinds, and then the back electrode is formed by sputtering or the like.

EXAMPLE

The present invention is described further in detail using examples as follows, but is not limited by the following examples.

Example 1

A float glass (soda-lime silica glass) sheet with a thickness of 3 mm that had been cut to have a square shape whose one side is 10 cm was washed and then was dried. On one surface of this glass sheet, an undercoating film and a transparent conductive film were deposited sequentially by the CVD method using a belt furnace. The undercoating film was formed to have a two-layer structure of a high refractive index film and a low refractive index film sequentially from the glass sheet side. The glass sheet was carried in the furnace using a mesh belt and was heated up to about 570° C. therein, and then the above-mentioned respective films were deposited.

Conditions for depositing respective films are described as follows.

Deposition of Tin Oxide Film (A High Refractive Index Film)

A mixed gas containing monobutyltin trichloride (vapor), oxygen, and nitrogen was supplied to deposit a tin oxide film with a thickness of 68 nm on a glass sheet.

Deposition of Silicon Oxide Film (A Low Refractive Index Film)

A mixed gas containing mono silane, ethylene, oxygen, and nitrogen was supplied to deposit a silicon oxide film with a thickness of 3 nm on the tin oxide film.

Deposition of $SnO_2$:F Film (A Transparent Conductive Film)

A mixed gas containing monobutyltin trichloride (vapor), oxygen, nitrogen, and hydrogen fluoride (vapor) was supplied to deposit a $SnO_2$:F film with a thickness of 200 nm on the silicon oxide film.

Table 1 shows the compositions of mixed gases used for depositing the respective films.

TABLE 1

| Type of Film | Composition of Mixed Gas (Volume Ratio) | | | | | |
|---|---|---|---|---|---|---|
| | $N_2$ | $O_2$ | HF | Sn | Si | $C_2H_4$ |
| Tin Oxide Film | 6 | 4 | 0 | 1 | 0 | 0 |
| Silicon Oxide Film | 200 | 4 | 0 | 0 | 1 | 6 |
| $SnO_2$:F Film | 6 | 4 | 1 | 4 | 0 | 0 |

In Table 1, monobutyltin trichloride is abbreviated as Sn and monosilane as Si.

Example 2

Two intermediate films of a tin oxide film (a high refractive index film) and a silicon oxide film (a low refractive index film), and a $SnO_2$:F film were deposited on a glass sheet as in Example 1 except that the thicknesses of the tin oxide film and the silicon oxide film were set to be 31 nm and 7 nm, respectively.

Comparative Example 1

A $SnO_2$:F film (with a thickness of 200 nm) was deposited directly on a glass sheet as in Example 1 except that the two intermediate films were not deposited.

Comparative Example 2

A silicon oxide film (with a thickness of 30 nm) and a $SnO_2$:F film (with a thickness of 200 nm) were deposited on a glass sheet sequentially as in Example 1 except that the tin oxide film (a high refractive index film) was not deposited.

Comparative Example 3

Two intermediate films of a tin oxide film (a high refractive index film) and a silicon oxide film (a low refractive index film), and a $SnO_2$:F film (with a thickness of 200 nm) were deposited on a glass sheet as in Example 1 except that the thicknesses of the tin oxide film and the silicon oxide film were set to be 18 nm and 28 nm, respectively.

With respect to glass sheets with a transparent conductive film thus obtained, spectral reflectance was measured according to JIS R3106-1998 with the glass sheet surface opposite to the surface on which the respective films had been formed positioned as the incident side. Table 2 shows the average reflectance in the wavelength region between 450 nm and 550 nm in each glass sheet with a transparent conductive film.

TABLE 2

| | Average Reflectance (%) 450 to 550 nm |
|---|---|
| Example 1 | 10.23 |
| Example 2 | 13.57 |
| Comparative Example 1 | 17.41 |
| Comparative Example 2 | 17.91 |
| Comparative Example 3 | 14.25 |

The wavelength region between 450 nm and 550 nm corresponds to the wavelength region of 500 nm±50 nm allowing amorphous silicon to have the maximum spectral sensitivity.

Table 3 shows the average reflectances in the wavelength regions between 450 nm and 550 nm and between 700 nm and 800 nm with respect to the glass sheets with a transparent conductive film according to Example 2 and the respective comparative examples.

TABLE 3

| | Average Reflectance (%) | |
|---|---|---|
| | 450 to 550 nm | 700 to 800 nm |
| Example 2 | 13.57 | 7.91 |
| Comparative Example 1 | 17.41 | 8.18 |
| Comparative Example 2 | 17.91 | 8.38 |

TABLE 3-continued

| | Average Reflectance (%) | |
|---|---|---|
| | 450 to 550 nm | 700 to 800 nm |
| Comparative Example 3 | 14.25 | 8.54 |

The wavelength region between 700 nm and 800 nm corresponds to the wavelength region of 750 nm±50 nm allowing crystalline silicon to have the maximum spectral sensitivity.

In Examples 1 and 2, the reflectances in the wavelength region between 450 nm and 550 nm correspond to 80% or lower of the case where no intermediate film has been formed (improved by about 7 points). Therefore, the film structures described in Examples 1 and 2 are suitable when an amorphous silicon material is used for a photovoltaic layer. In Example 2, compared to the case where no intermediate film is formed (Comparative Example 1), both the reflectances in the wavelength regions between 450 nm and 550 nm and between 700 nm and 800 nm are decreased (improved by about 4 points and about 0.3 point in the wavelength regions). Therefore, the film structure described in Example 2 is suitable in the case of employing both a photovoltaic layer containing an amorphous silicon material and a photovoltaic layer containing a crystalline silicon material.

The film thickness of the silicon oxide film used in Comparative Example 2 corresponds to the thickness of a film that has been formed as a barrier film. The film thicknesses used in Comparative Example 3 correspond to those described in JP 3-72586 B to cancel the iridescence of a transparent conductive film. In such conventional intermediate films, the reflectance in the wavelength region allowing a photovoltaic unit to have a high sensitivity cannot be decreased to the same degree as those in Examples 1 and 2.

Examples 3 to 5

A glass sheet with a transparent conductive film was manufactured using a device for depositing a film on a glass ribbon as described above.

From a coater positioned on the furthest upstream side, a mixed gas containing dimethyltin dichloride (DMT) (vapor), oxygen, helium, and nitrogen was supplied. Then, from a coater on the downstream side, a mixed gas containing monosilane, ethylene, oxygen, and nitrogen was supplied. Subsequently, from a coater on the further downstream side, a mixed gas containing dimethyltin dichloride (vapor), oxygen, water vapor, nitrogen, and hydrogen fluoride (vapor) was supplied. Thus, a tin oxide film, a silicon oxide film, and a fluorine-containing tin oxide film (a $SnO_2$:F film) were stacked on the top surface of a glass ribbon in this order, which then was cut, thus obtaining a glass sheet with a transparent conductive film.

Comparative Examples 4 to 6

By supplying the same mixed gases as those in the above only from the coaters from which the mixed gases for depositing the silicon oxide film and the $SnO_2$:F film were supplied in Examples 3 to 5, a glass sheet with a transparent conductive film was obtained. In the glass sheet with a transparent conductive film, the same silicon oxide film and $SnO_2$:F film as those in the respective examples were deposited on a glass sheet in this order. In this case, the thickness of the silicon oxide film was set to be 30 nm in the respective comparative examples.

With respect to the glass sheets with a transparent conductive film obtained according to Examples 3 to 5 and Comparative Examples 4 to 6, the average reflectances in the same wavelength regions as those described above were measured. Table 4 shows the measurement results of the average reflectances together with the thicknesses of respective films.

TABLE 4

| | Film Deposition on Glass Ribbon | | | | |
|---|---|---|---|---|---|
| | Tin Oxide Film | Silicon Oxide Film | $SnO_2$:F Film | Average Reflectance (%) | |
| | Thickness (nm) | Thickness (nm) | Thickness (nm) | 450 to 550 nm | 700 to 800 nm |
| Example 3 | 45 | 15 | 460 | 9.84 | 10.31 |
| Comparative Example 4 | — | 30 | 460 | 14.3 | 10.87 |
| Example 4 | 29 | 33 | 600 | 9.21 | 10.95 |
| Comparative Example 5 | — | 30 | 600 | 13.9 | 11.32 |
| Example 5 | 20 | 35 | 790 | 8.71 | 11.84 |
| Comparative Example 6 | — | 30 | 790 | 8.78 | 11.97 |

In Examples 3 to 5, the average reflectances in both the wavelength regions are decreased compared to the case where the undercoating film of a silicon oxide film with a thickness of 30 nm was formed. According to the present invention in which the optical reflection characteristic in the wavelength region allowing the photovoltaic unit to have a high sensitivity is improved by using a reflection prevention effect of the intermediate film, the quantity of incident light entering the photovoltaic unit can be increased without deteriorating the conductivity of the transparent conductive film. In the present invention, the structure of the intermediate film is not limited to those examples described above as long as the refractive index, the number of layers to be stacked, and the thickness of the intermediate film are designed so as to obtain the reflection prevention effect described above. In the above respective examples, the optical characteristics were measured with a photovoltaic unit omitted. However, it has been confirmed that the photovoltaic unit has substantially no influence on the ratio of the reflectance of incident light entering from the glass sheet side in each of the above-mentioned examples to that in the corresponding comparative example. In other words, the ratio when no photovoltaic unit is formed in both the example and the corresponding comparative example is substantially the same as that when photovoltaic units are formed in the example and the corresponding comparative example, provided that the photovoltaic units have the same structure and thickness.

Example 6

On the glass sheet with a transparent conductive film according to Example 2, an amorphous silicon photovoltaic unit was formed by a plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by a RF plasma CVD method. As film deposition conditions, a reacting gas of silane, a pressure inside a reaction chamber of about 40 Pa, a RF power density of 15 mW/cm$^2$, and a film deposition temperature of 150° C. were used. An intrinsic amorphous silicon film deposited directly on a glass substrate to have a thickness of 300 nm under the same film deposition conditions as those described above had a dark conductivity of 5×10$^{-10}$ S/cm. The thickness of the intrinsic amorphous silicon layer was set to be 300 nm. Finally, as a back electrode, an ITO film with a thickness of 80 nm and a Ag film with a thickness of 300 nm were deposited by sputtering in this order.

The output characteristics of the thin film photoelectric conversion device (with a photovoltaic area of 1 cm$^2$) thus produced were measured while light of AM1.5 (100 mW/cm$^2$) was irradiated as incident light. The results included an open circuit voltage of 0.89V, a short-circuit current density of 16.4 mW/cm$^2$, a fill factor of 72.0%, and a conversion efficiency of 10.5%. Further, an optical degradation test was carried out by irradiating light of AM1.5 (100 mW/cm$^2$) at 48° C. After 550 hours irradiation, the conversion efficiency was deteriorated up to 8.7%.

Example 7

A float glass (soda-lime silica glass) sheet with a thickness of 3 mm that had been cut to have a square shape whose one side is 10 cm was washed and then was dried. On one surface of this glass sheet, two undercoating films (a high refractive index film and a low refractive index film) and a transparent conductive film were deposited sequentially by the CVD method using a belt furnace. The glass sheet was carried in the furnace using a mesh belt and was heated up to about 570° C. therein, and then the above-mentioned respective films were deposited.
Deposition of Tin Oxide Film (A High Refractive Index Film)

A mixed gas containing monobutyltin trichloride (vapor), oxygen, and nitrogen was supplied to deposit a tin oxide film with a thickness of 28 nm on a glass sheet.
Deposition of a Silicon Oxide Film (A Low Refractive Index Film)

A mixed gas containing monosilane, ethylene, oxygen, and nitrogen was supplied to deposit a silicon oxide film with a thickness of 24 nm on the tin oxide film.
Deposition of SnO$_1$:F Film (A Transparent Conductive Film)

A mixed gas containing monobutyltin trichloride (vapor), oxygen, nitrogen, and hydrogen fluoride (vapor) was supplied to deposit a SnO$_2$:F film with a thickness of 620 nm on the silicon oxide film.

Table 5 shows the compositions of mixed gases used for depositing the respective films.

TABLE 5

| Type of Film | Composition of Mixed Gas (Volume Ratio) | | | | | |
|---|---|---|---|---|---|---|
| | N$_2$ | O$_2$ | HF | Sn | Si | C$_2$H$_4$ |
| Tin Oxide Film | 6 | 4 | 0 | 1 | 0 | 0 |
| Silicon Oxide Film | 200 | 4 | 0 | 0 | 1 | 6 |
| SnO$_2$:F Film | 6 | 4 | 1 | 4 | 0 | 0 |

In Table 5, monobutyltin trichloride is abbreviated as Sn and monosilane as Si.

Example 8

As in Example 7, a tin oxide film with a thickness of 32 nm, a silicon oxide film with a thickness of about 22 nm, and a SnO$_2$:F film with a thickness of 720 nm were deposited sequentially on a glass sheet.

Example 9

As in Example 7, a tin oxide film with a thickness of 30 nm, a silicon oxide film with a thickness of about 24 nm, and a SnO$_2$:F film with a thickness of 900 nm were deposited sequentially on a glass sheet.

Example 10

As in Example 7, a tin oxide film with a thickness of 23 nm, a silicon oxide film with a thickness of about 26 nm, and a SnO$_2$:F film with a thickness of 450 nm were deposited sequentially on a glass sheet.

Comparative Example 7

As in Example 7 except that the tin oxide film and the silicon oxide film were not deposited, a SnO$_2$:F film with a thickness of 620 nm was deposited directly on a glass sheet.

Comparative Example 8

As in Example 7 except that the tin oxide film was not deposited, a silicon oxide film with a thickness of 30 nm and a SnO$_2$:F film with a thickness of 620 nm were deposited sequentially on a glass sheet.

With respect to the glass sheets with a transparent conductive film thus obtained, the visible light transmittance and visible light reflectance were measured according to JIS R3106-1998 with the glass sheet surface opposite to the surface on which the respective films had been formed being positioned on the incident side. The results are shown in Table 6.

TABLE 6

| | Visible Light Transmittance (%) | Visible Light Reflectance (%) |
|---|---|---|
| Example 7 | 85.59 | 6.63 |
| Example 8 | 85.52 | 5.74 |
| Example 9 | 84.81 | 4.69 |
| Example 10 | 85.8 | 6.89 |
| Comparative Example 7 | 84.88 | 7.45 |
| Comparative Example 8 | 84.73 | 7.62 |

Comparative Examples 9 to 12

The thickness of the SnO$_2$:F film was adjusted to be the same as that in any one of Examples 7 to 10 while the thicknesses of the tin oxide film and the silicon oxide film were varied. Thus, respective films were deposited on a glass sheet. In any of Comparative Examples 9 to 12, the thicknesses of the tin oxide film and the silicon oxide film were set to be 18 nm and 28 nm, respectively. The method of depositing the films was the same as in Example 7. With respect to the glass sheets with a transparent conductive film thus obtained, the visible light transmittance and visible light reflectance were measured as in the above. Table 7 shows values obtained from Examples 7 to 10 and Comparative Examples 9 to 12, which are compared between those with the same thickness of the transparent conductive film, respectively.

TABLE 7

|  | Visible Light Transmittance (%) | Visible Light Reflectance (%) |
|---|---|---|
| Example 7 | 85.59 | 6.63 |
| Comparative Example 9 | 85.50 | 6.75 |
| Example 8 | 85.52 | 5.74 |
| Comparative Example 10 | 85.28 | 6.02 |
| Example 9 | 84.81 | 4.69 |
| Comparative Example 11 | 84.62 | 4.93 |
| Example 10 | 85.8 | 6.89 |
| Comparative Example 12 | 85.7 | 6.97 |

The film thicknesses used in Comparative Examples 9 to 12 correspond to those disclosed in an example in JP 3-72586 B to cancel the iridescence of a transparent conductive film. In JP 3-72586 B, the film thicknesses are used to cancel the iridescence of the $SnO_2$:F film with a thickness of 200 nm. The $SnO_2$:F film with a thickness of about 200 nm is suitable for decreasing the heat radiation of window glass for buildings. However, since the $SnO_2$:F film is used as a transparent electrode in a substrate for a photoelectric conversion device, it is necessary to increase the thickness of the film to decrease the resistance. In order to use it for window glass for buildings, the appearance is especially important. On the other hand, however, in order to use it for a solar cell or the like, excellent light transmission characteristics and reflection characteristics are more important. Therefore, it also is required to control the film used between the glass sheet and the $SnO_2$:F film suitably according to the intended use and the difference in thickness of the $SnO_2$:F film.

In Examples 7 to 10, the thicknesses of the tin oxide film and the silicon oxide film were set to be in a more suitable range than that in the comparative examples, thus improving the optical characteristics by about 0.1 to 0.2% while the thickness of the transparent conductive film was not changed. It is surmised that at least a part of the factor causing the decrease in visible light reflectance is the increase in roughness of the film surface due to the increase in its thickness of the tin oxide film of a polycrystalline film.

Examples 11 and 12

In the following examples, films were deposited using a device for depositing a film on a glass ribbon as described above. Inside a float bath, 98 vol. % nitrogen and 2 vol. % hydrogen were supplied so that the pressure inside the bath was maintained to be slightly higher than that outside the bath, and thus the inside of the bath was maintained in a nonoxidative atmosphere. Molten soda-lime silica glass (colorless) with a general flat glass composition was poured into the float bath from a furnace, which then was formed into a glass ribbon with a thickness of 4 mm. After the film deposition, the glass ribbon was annealed in an annealing furnace and was cut to have a predetermined size on the further downstream side. The temperature of the glass ribbon was measured using a pyrometer at a location on a slightly upstream side from the place where the films were formed.

The film deposition on the glass ribbon was carried out with the following procedure. In Example 11, from a coater positioned on the furthest upstream side, a mixed gas containing dimethyltin dichloride (vapor), oxygen, helium, and nitrogen was supplied to deposit a tin oxide film with a thickness of 26 nm on a glass ribbon. Then, from a coater on the downstream side, a mixed gas containing monosilane, ethylene, oxygen, and nitrogen was supplied to deposit a silicon oxide film with a thickness of 25 nm. Subsequently, from a coater on the further downstream side, a mixed gas containing dimethyltin dichloride (vapor), oxygen, water vapor, nitrogen, and hydrogen fluoride (vapor) was supplied to deposit a $SnO_2$:F film with a thickness of 450 nm on the silicon oxide film. The glass ribbon directly before reaching the coater on the furthest upstream side had a temperature of 700° C.

In Example 12, from a coater positioned on the furthest upstream side, the same mixed gas as in Example 11 was supplied to deposit a tin oxide film with a thickness of 28 nm on a glass ribbon. Then, from a coater on the downstream side, a mixed gas containing monosilane, ethylene, oxygen, and nitrogen was supplied to deposit a silicon oxycarbide (SiOC) film with a thickness of 20 nm. In this case, the rate of ethylene content was increased to introduce carbon into the film. Subsequently, from a coater on the further downstream side, the same mixed gas as in Example 11 was supplied to deposit a $SnO_2$:F film with a thickness of 680 nm on the silicon oxycarbide film. Similarly in this case, the glass ribbon directly before reaching the coater on the furthest upstream side had a temperature of 700° C.

Table 8 shows characteristics of the respective glass sheets with a transparent conductive film obtained according to Examples 11 and 12.

TABLE 8

|  | Visible Light Transmittance (%) | Visible Light Reflectance (%) |
|---|---|---|
| Example 11 | 85.7 | 7.04 |
| Example 12 | 85.5 | 6.42 |

Generally, in the $SnO_2$:F film, in view of its characteristics, it is difficult to improve both the light transmittance and conductivity simultaneously. In many cases, the improvement of one of the characteristics causes the deterioration of the other characteristic. Therefore, the improvement in the light transmission characteristics without deteriorating the conductivity of the transparent conductive film has great significance.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A photoelectric conversion device, comprising:
a transparent substrate;
a transparent conductive film;
a photoelectric conversion unit including a photoelectric conversion layer; and
a back electrode,
the transparent substrate, the transparent conductive film, the photoelectric conversion unit, and the back electrode being stacked sequentially from a side on which light is incident,
wherein the photoelectric conversion device further comprises an intermediate film between the transparent substrate and the transparent conductive film, and the photoelectric conversion device satisfies a relationship of $R_1<R_2\times 0.8$, wherein $R_1$ represents an average reflectance of the photoelectric conversion device in a wavelength region between ($\lambda$−50) nm and ($\lambda$+50) nm, where $\lambda$ (nm) indicates a wavelength of the light allowing the photoelectric conversion layer to have an optimal spectral sensitivity characteristic, and $R_2$ denotes an average reflectance, in the wavelength region, of the photoelectric conversion device that does not include the intermediate film.

2. The photoelectric conversion device according to claim 1, wherein the intermediate film is formed of two layers of a first film with a relatively high refractive index and a second film with a relatively low refractive index sequentially from a side of the transparent substrate.

3. The photoelectric conversion device according to claim 2, wherein the first film has a refractive index in a range between 1.7 and 2.7, and the second film has a refractive index in a range between 1.4 and 1.8.

4. The photoelectric conversion device according to claim 2, wherein the first film has a thickness of at least 20 nm.

5. The photoelectric conversion device according to claim 1, wherein the intermediate film comprises a layer containing silicon oxide as a main component.

6. A photoelectric conversion device, comprising
a transparent substrate;
a transparent conductive film;
at least two photoelectric conversion units; and
a back electrode,
the transparent substrate, the transparent conductive film, the at least two photoelectric conversion units, and the back electrode being stacked sequentially from a side on which light is incident, and the at least two photoelectric conversion units including two photoelectric conversion layers in which wavelengths $\lambda$ of the light allowing optimal spectral sensitivity characteristics to be obtained are different from each other,
wherein the photoelectric conversion device further comprises an intermediate film formed between the transparent substrate and the transparent conductive film, and
the photoelectric conversion device satisfies relationships of:

$R_{11}<R_{12}$, wherein $R_{11}$ represents an average reflectance of the photoelectric conversion device in a first wavelength region between ($\lambda_1$−50) nm and ($\lambda_1$+50) nm, where $\lambda_1$ (nm) represents one of the wavelengths $\lambda$ in one of the two photoelectric conversion layers, and $R_{12}$ denotes an average reflectance, in the first wavelength region, of the photoelectric conversion device that does not include the intermediate film; and $R_{21}<R_{22}$, wherein $R_{21}$ represents an average reflectance of the photoelectric conversion device in a second wavelength region between ($\lambda_2$−50) nm and ($\lambda_2$+50) nm, where $\lambda_2$ (nm) represents the other of the wavelengths $\lambda$ in the other of the two photoelectric conversion layers, and $R_{22}$ denotes an average reflectance, in the second wavelength region, of the photoelectric conversion device that does not include the intermediate film.

7. The photoelectric conversion device according to claim 6, wherein the two photoelectric conversion layers in which wavelengths $\lambda$ of the light allowing optimal spectral sensitivity characteristics to be obtained are different from each other comprise at least one selected from an amorphous silicon-based photoelectric conversion layer and a crystalline silicon-based photoelectric conversion layer.

8. The photoelectric conversion device according to claim 6, wherein the intermediate film is formed of two layers of a first film with a relatively high refractive index and a second film with a relatively low refractive index sequentially from a side of the transparent substrate.

9. The photoelectric conversion device according to claim 8, wherein the first film has a refractive index in a range between 1.7 and 2.7, and the second film has a refractive index in a range between 1.4 and 1.8.

10. The photoelectric conversion device according to claim 9, wherein the first film has a thickness of at least 20 nm.

11. The photoelectric conversion device according to claim 6, wherein the intermediate film comprises a film containing silicon oxide as a main component.

* * * * *